United States Patent

Asada et al.

[11] Patent Number: 5,936,440
[45] Date of Patent: Aug. 10, 1999

[54] INDUCTIVE LOAD DRIVING APPARATUS

[75] Inventors: Tadatoshi Asada, Anjo; Tadashi Uematsu, Kariya; Wakako Kanazawa, Toyokawa, all of Japan

[73] Assignee: Denso Corporation, Kariya, Japan

[21] Appl. No.: 08/984,008

[22] Filed: Dec. 3, 1997

[30] Foreign Application Priority Data

Dec. 4, 1996 [JP] Japan .................................. 8-323899

[51] Int. Cl.$^6$ ...................................................... H03B 1/00
[52] U.S. Cl. ............................................ 327/110; 327/309
[58] Field of Search .................................... 327/110, 309, 327/310, 312, 313, 314, 323, 324, 325, 328

[56] References Cited

U.S. PATENT DOCUMENTS

| | | | |
|---|---|---|---|
| 4,831,322 | 5/1989 | Mashino et al. | 322/28 |
| 5,075,568 | 12/1991 | Bilotti et al. | 307/270 |
| 5,541,806 | 7/1996 | Hoffman | 361/160 |

FOREIGN PATENT DOCUMENTS

| | | |
|---|---|---|
| 2-254993 | 10/1990 | Japan . |
| 4-96696 | 3/1992 | Japan . |
| 6-113537 | 4/1994 | Japan . |

*Primary Examiner*—Terry D. Cunningham
*Assistant Examiner*—Jeffrey Zweizig
*Attorney, Agent, or Firm*—Pillsbury Madison & Sutro LLP

[57] ABSTRACT

An inductive load driving apparatus for controlling current supplied from a battery to an inductor such as a generator field coil is composed of a first N-channel MOSFET switching element connected between a high-side terminal of the inductor and a high-side terminal of the battery, a second N-channel MOSFET switching element connected in parallel with the inductive load and a protection circuit having a back-flow current detecting element turning off the second N-channel MOSFET switching element when the inductor does not generate back-flow current. The second N-channel MOSFET switching element is turned on when the first N-channel MOSFET switching element is turned off and turned off when the first switching element is turned on. The first and second N-channel MOSFET switching elements are disposed integrally with each other on a semiconductor chip.

12 Claims, 5 Drawing Sheets

INDUCTIVE LOAD DRIVING APPARATUS

CROSS REFERENCE TO RELATED APPLICATION

The present application is based on and claims priority from Japanese Patent Application No. Hei 8-323899, filed on Dec. 4, 1996, the contents of which are incorporated herein by reference.

BACKGROUND OF THE INVENTION

1. Field of the Invention

The present invention relates to a circuit for driving an inductive load such as a coil or an inductor.

2. Description of the Related Art

In a conventional control circuit for a vehicular generator, the output voltage thereof is regulated by on-off control of the current supplied to the field coil. The field coil has a large inductance and, therefore, is a kind of an inductive load. In order to supply back-flow current to the field coil, a back-flow element such as a flywheel diode is connected to the field coil.

However, such a flywheel diode has a considerably large forward voltage drop and generates considerable heat, and the size of the diode must be increased in order to reduce the current density. It is also necessary to eliminate accumulation of the carriers near the pn junction. For this purpose, additional current is supplied to recombine the carriers when the field coil is energized. This causes switching noises and increases the response time of the switching operation.

SUMMARY OF THE INVENTION

Therefore, a main object of the present invention is to provide an improved apparatus for driving an inductive load.

Another object of the present invention is to provide a compact and noise-free inductive load driving apparatus which has high response speed.

According to a main feature of the present invention, an inductive load driving apparatus is composed of a high-side switching element connected between one of terminals of the battery and one of terminals of the inductive load, a first control circuit connected to the gate of the high-side switching element, a low-side switching element connected in parallel with the inductive load, a second control circuit connected to the gate of the low-side switching element, and a protection circuit having a back-flow current detecting element for turning off the low-side switching element when the inductive load does not generate back-flow current. The low-side switching element is composed of a MOSFET and the control circuit turns on the MOSFET when the high-side switching element is turned off and turns off the low-side switching element when the high-side switching element is turned on. The MOSFET has lower on-resistance and reduces heat generation significantly. Further, the carrier accumulation on the pn junction is eliminated so that high speed response for the switching operation can be ensured.

The inductive load driving apparatus as stated above may have a battery voltage detecting circuit, and, preferably, each of the high-side and low-side switching elements is composed of an N-channel MOSFET. The first control circuit may include a booster circuit connected between the battery and the gate of the high-side switching element and may also include a battery voltage detecting circuit so that the first control circuit can regulate battery voltage by turning on and off the high-side switching element. The high-side and low-side switching elements of the inductive load driving apparatus may be disposed integrally with each other on a semiconductor chip. In addition, the battery voltage detecting circuit may be disposed integrally with the high-side and low-side switching elements on the semiconductor chip. In this case, it is preferable that the high-side switching element has space area of the chip between 0.65 and 0.85 of the total space area of the high-side switching and the low-side switching elements.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS (First Embodiment)

Figure 1:
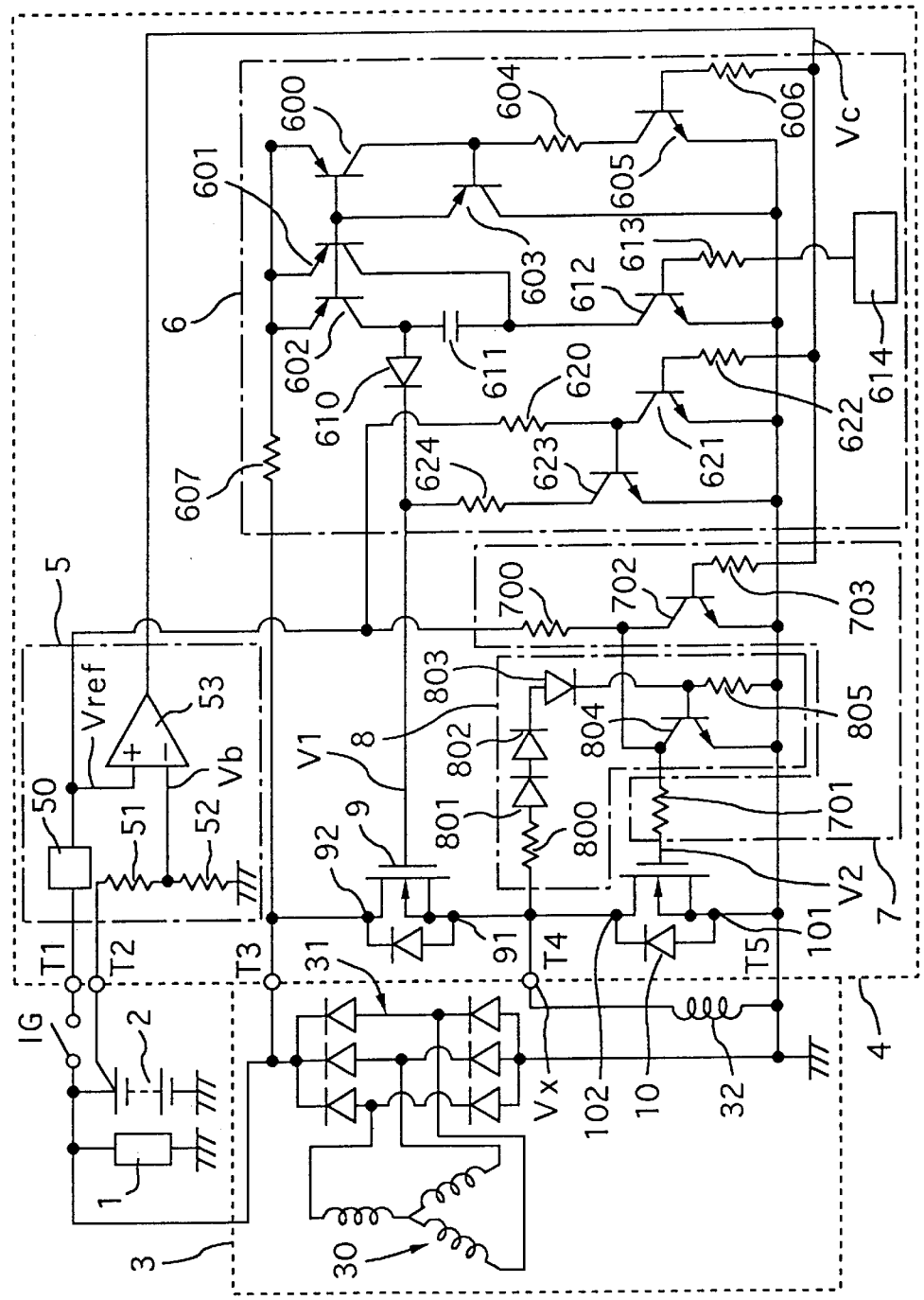
FIG. 1 is a circuit diagram of a driving circuit of an inductive load according to a first embodiment of the present invention.

An inductive load driving apparatus according to a first embodiment is described with reference to FIG. 1.

A vehicle load 1 and a vehicle battery 2 are connected to an alternator 3. The output voltage of the alternator 3 is controlled by a control apparatus 4. The control apparatus 4 is composed of a battery voltage detecting circuit 5, a first driving circuit 6, a second driving circuit 7, a protecting circuit 8, a first or high-side switching element 9 and a second or low-side switching element 10.

The alternator 3 is composed of a three-phase armature winding 30, a three-phase-full-wave rectifier 31, and a field coil 32. The output power of the alternator 3 is rectified by the rectifier 31 and supplied to the vehicle load 1 and to the vehicle battery 2. The high-side terminal of the field coil 32 is connected through the high-side switching element 9 to the battery 2 and is grounded through the low-side switching element 10. The low-side terminal of the field coil 32 is grounded.

The battery voltage detecting circuit 5 is composed of a constant voltage circuit 50 connected to the battery 2 through the ignition switch IG, a voltage dividing circuit having series-connected resistors 51 and 52 and a comparator 53. The voltage dividing circuit provides a voltage Vb which divided from the battery voltage. The constant voltage circuit 50 supplies a constant reference voltage Vref to the comparator 53, and the comparator 53 provides the driving circuits 6 and 7 with a generation control signal Vc.

The first driving circuit 6 is composed of transistors 600–603, 605, 612, 621 and 623, resistors 604, 606, 607, 613, 620, 622 and 624, a diode 610, a capacitor 611 and a clock 614. The first driving circuit 6 provides the high-side switching element with a control signal V1 according to the generation control signal Vc which is the output signal of the comparator 53.

The second driving circuit 7 is composed of a transistor 702 and resistors 700, 701, and 703, and provides the low-side switching element 10 with a control signal V2 according to the generation control signal Vc.

The protection circuit 8 is composed of a transistor 804, resistors 800 and 805 and diodes 801–803. The protection circuit 8 modulates the control signal V2 supplied to the gate of the low-side switching element 10 according to a voltage Vx of the high-side terminal of the field coil 32.

Each of the high-side and low-side switching elements 9 and 10 is composed of an N-channel MOSFET. The P-well domain of the high-side switching element 9 is connected to an N-type main terminal 91 on the side of the field coil 32. The P-well domain of the low-side switching element 10 is connected to an N-type main terminal 101 on the side of the grounded portion.

The generation control signal Vc becomes high level when the divided voltage Vb is lower than the reference voltage Vref, and low level when the divided voltage is equal to or higher than the reference voltage Vref.

If the generation control signal Vc becomes high level, the transistor 605 of the first driving circuit 6 is turned on, and the transistors 603, 600–602 are turned on. When the clock 614 provides the base of the transistor 612 with a high level signal through the resistor 613, the transistor 612 turns on to ground the low-side terminal of the capacitor 611. Consequently, the capacitor 611 is charged through the transistor 602 and becomes high level. When the clock 614 provides the base of the transistor 612 with a low level signal, the transistor 612 is turned off and, consequently, the capacitor 611 is charged from the low-side terminal thereof through the transistor 601 in the opposite direction, so that the high side terminal of the capacitor 611 becomes higher than the battery voltage by a voltage proportional to an amount of the electric charge of the capacitor 611. Thus, the high-side terminal of the capacitor 611 provides a boost voltage. The boost voltage is applied to the gate of the high-side switching element 9 through the diode 610 to turn on the same. The high level generation control signal Vc also turns on the transistor 621 through the resistor 622, thereby turning off the transistor 623. It is noted that the transistors 601, 602 and 612, the diode 610, the capacitor 611 and the clock 614 compose a booster circuit.

The high level generation control signal Vc also turns on the transistor 702 of the second driving circuit. Thus, electric charge of the gate of the low-side switching element 10 is discharged through the resistor 701 and the transistor 702 to the ground, so that the low-side switching element 10 turns off a certain delay time after the generator control signal turns on the transistor 702. The delay time is set according to the resistances of the resistor 701 and a capacity of the gate of the low-side switching element 10.

Thus, the second driving circuit 7 turns off the low-side switching element 10 the delay time after the battery voltage becomes lower than a regular battery voltage proportional to the reference voltage, and turns on the same a certain time after the battery voltage becomes equal to or higher than the regular battery voltage. When the low-side switching element 10 turns on, and the high-side terminal of the field coil 32 becomes lower than the ground voltage, back-flow current flows from a grounded portion through the channel and parasitic diode to the high-side terminal of the field coil 32. Accordingly, the field coil 32 is supplied from the low-side switching element 10 with the back-flow current.

If the generation control signal Vc is low level, the transistor 605 of the first driving circuit 6 is turned off, and the transistors 603, 600–602 are turned off. As a result, the boost voltage is not applied to the base of the high-side switching element 9. The low level generator control signal Vc also turns off the transistor 621. This turns on the transistor 623 so that the capacitor 611 discharges the electric charge through the diode 610 and the resistor 624 to turn off the high-side switching element 9. The first driving circuit 6 turns on the high-side switching element 9 only when the battery voltage is lower than the regular battery voltage so that the alternator can generate output power sufficient to charge the vehicle load 1 and battery 2 through the rectifier 31.

The low level generation control signal Vc also turns off the transistor 702 of the second driving circuit 7. Thus, current is supplied from the battery 2 through the resistors 700 and 701 to the gate of the low-side switching element 10, so that the low-side switching element 10 is turned on a certain delay time after the generation control signal Vc becomes low level. The delay time is set according to the sum of the resistances of the resistor 700 and the resistor 701, and the capacity of the gate of the low-side switching element 10.

The protection circuit 8 detects the voltage Vx of the high-side terminal of the field coil and controls the operation of the low-side switching element 10. The protection circuit 8 is composed of a voltage dividing circuit having a resistor 800, level shifting diodes 801-803 and a resistor 805 and a transistor 804. The transistor 804 controls the gate voltage of the low-side switching element 10 according to the output voltage of this voltage dividing circuit. This voltage dividing circuit turns on the transistor 804 when the divided voltage (the voltage at the junction of the diode 803 and the resistor 805) is higher than the threshold voltage of the transistor 804. After electric charge of the gate of the low-side switching element 10 discharges through the resistor 701 and the transistor 804, the low-side switching element 10 turns off, as described above. On the other hand, the transistor 804 is turned off when the divided voltage becomes lower than the threshold voltage of the transistor 804. If the transistor 702 is turned off, the gate of the low-side switching element 10 is charged from the battery 2 through the resistors 700 and 701, so that the low-side switching element 10 turns on, as described above. If the voltage Vx of the high-side terminal of the field coil 32 is lower than the ground voltage, the back-flow current flows through the low-side switching element 10 to the field coil 32.

In summary, the generation control signal Vc provided by the battery voltage detection circuit 5 controls the high-side and low-side switching elements 9 and 10 via the first and second driving circuits 6 and 7. The protection circuit 8 detects the field coil voltage Vx and turns off the low-side switching element 10 only when the field coil voltage Vx is higher than a certain voltage.

5

(Second Embodiment)

Figure 2:
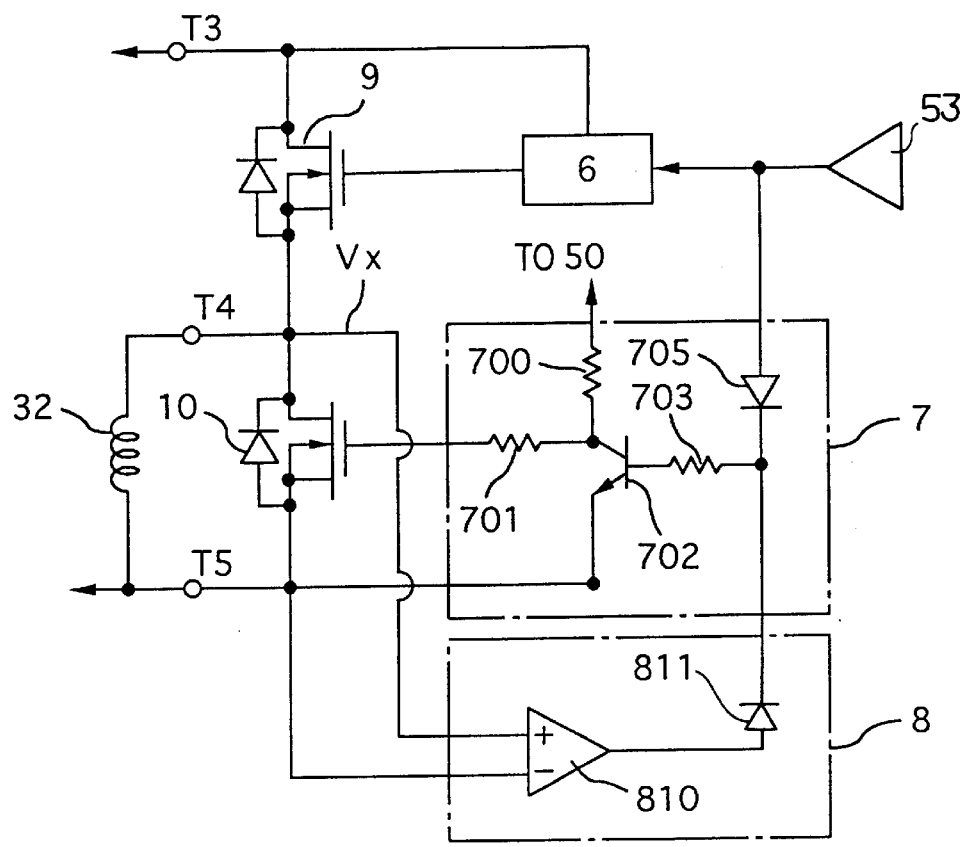
FIG. 2 is a circuit diagram of a driving circuit of an inductive load according to a second embodiment of the present invention.

An inductive load driving apparatus according to a second embodiment of the present invention is described with reference to FIG. 1 and FIG. 2. The second driving circuit 7 and the protection circuit 8 are different from those of the driving apparatus according to the first embodiment. The parts and/or components which are the same or substantially the same in function are denoted by the same reference numerals and descriptions thereof are omitted.

The second driving circuit 7 has an additional diode 705 connected between the resistor 703 and the output terminal of the comparator 53 of the driving apparatus according to the first embodiment. The protection circuit 8 is composed of a comparator 810 and a diode 811. The comparator 810 has input terminals connected across the low-side switching element 10 and the output terminal connected to the resistor 703 through the diode 811. The diode 811 is connected to interrupt current flowing to the comparator 810 from the resistor 703.

When the field coil voltage Vx is positive or higher than the ground voltage, the comparator 810 provides the base of the transistor 702 with the high level voltage through the diode 811 to turn on the transistor 702. Consequently, the low-side switching element 10 is turned off irrespective of the voltage level of the generation control voltage Vc. On the other hand, when the field coil voltage Vx is lower than the ground voltage, the comparator 810 provides the low level voltage so that the transistor 702 is controlled according to the generation control signal Vc in the manner described for the first embodiment. The low-side switching element 10 turns on when the high-side switching element 9 turns off, and the former turns off when the latter turns on.

The potential of the lower input terminal of the comparator 810 can be changed from the ground potential to another suitable potential.

(Third Embodiment)

Figure 3:
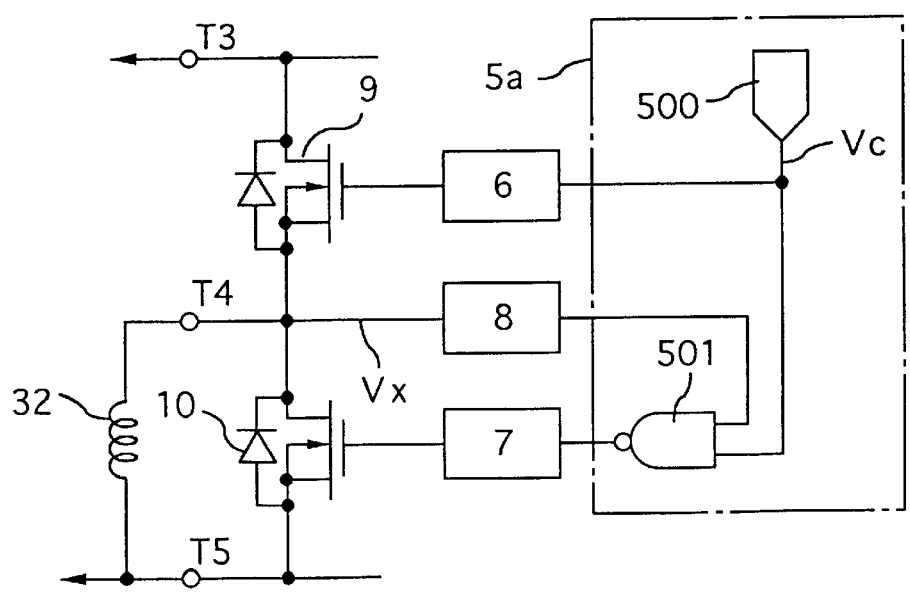
FIG. 3 is a circuit diagram of a part an inductive load driving apparatus according to a third embodiment of the present invention.

An inductive load driving apparatus according to a third embodiment of the present invention is described with reference to FIG. 1 and FIG. 3. The battery voltage detecting circuit 5 of the driving apparatus according to the first embodiment is replaced by a field-coil control circuit 5a. The parts and/or components which are the same or substantially the same in function are denoted by the same reference numerals and descriptions thereof are omitted.

The control circuit 5a is composed of a generation-control-signal circuit 500 which provides the generation control signal Vc and a NAND gate 501 which has one input terminal connected to the output terminal of the generation-control-signal circuit 500 and the other input terminal connected to the protection circuit 8 and the output terminal connected to the second driving circuit 7.

The protection circuit 8 provides the high level signal when the coil voltage Vx is lower than the ground voltage, and provides the low level signal when the coil voltage Vx is not lower than the ground voltage.

The second driving circuit 7 turns on the low-side switching element 10 when the coil voltage Vx is lower than the ground voltage and the generation control signal Vc is low level. If the generation control signal Vc is high level, the second driving circuit 7 turns off the low-side switching element 10 even if the coil voltage Vx is lower than the ground voltage. That is, as long as the coil voltage Vx is lower than the ground voltage, the low-side switching element 10 is controlled according to the generation control signal Vc. The first driving circuit 6 turns on the high-side switching element 9 when the second driving circuit turns

6 off the low-side switching element 10, and turns off the high-side switching element 10 when the second driving circuit turns on the low-side switching element. When the coil voltage Vx is higher than the ground level, the second driving circuit 7 turns off the low-side switching element 10 irrespective of the level of the generation control signal Vc.

(Fourth Embodiment)

Figure 4:
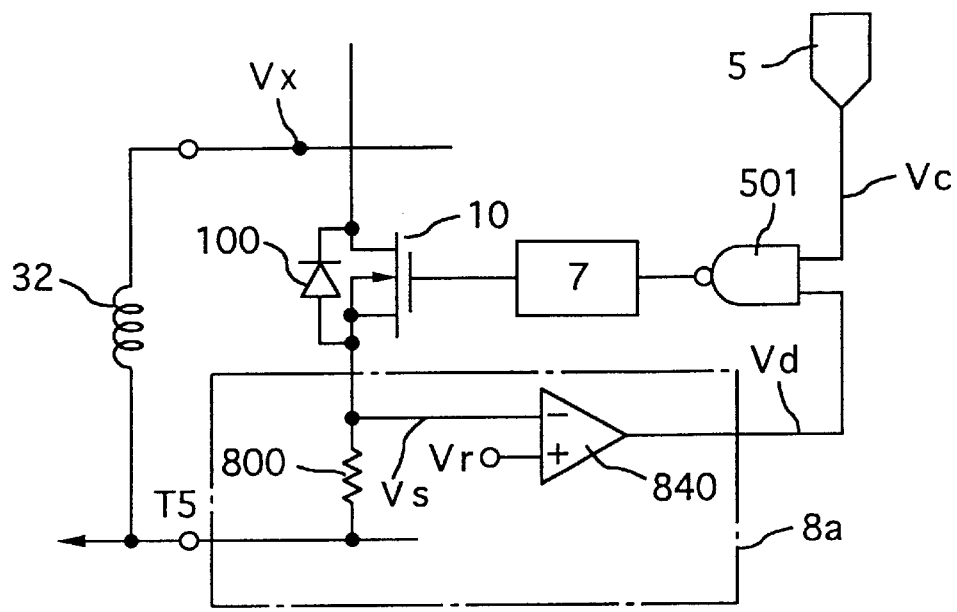
FIG. 4 is a circuit diagram of a part of an inductive load driving apparatus according to a fourth embodiment of the present invention.

An inductive load driving apparatus according to a fourth embodiment of the present invention is described with reference to FIG. 1 and FIG. 4. The protection circuit 8 of the driving apparatus according to the first embodiment is replaced by a modified protection circuit 8a. The parts and/or components which are the same or substantially the same in function are denoted by the same reference numerals and descriptions thereof are omitted.

The protection circuit 8a is composed of a resistor 800 which has a small resistance and is connected the ground and the low-side switching element 10 and a comparator 840 which compares a voltage drop Vs of the resistor 800 and a reference voltage Vr and supplies the output signal to one of the input terminals of the NAND gate 501. The reference voltage Vr is negative and nearly ground potential.

Thus, when the coil voltage Vx lowers, back-flow current flows through the parasitic diode 100 of the low-side switching element 10, and the voltage drop Vs becomes lower than the reference voltage Vr. Accordingly, the comparator 840 provides the NAND gate 501 with the high level signal, thereby supplying the gate of the low-side switching element 10 with the high level signal to turn on the same if the generation control signal Vc is low level. Thus, the on-resistance of the low-side switching element 10 is reduced so that the back-flow current can be supplied to the field coil 32 without substantial loss.

The resistor 800 can be connected between the high-side terminal of the field coil 32 and the N-type main terminal of the low-side switching element 10.

(Fifth Embodiment)

Figure 5:
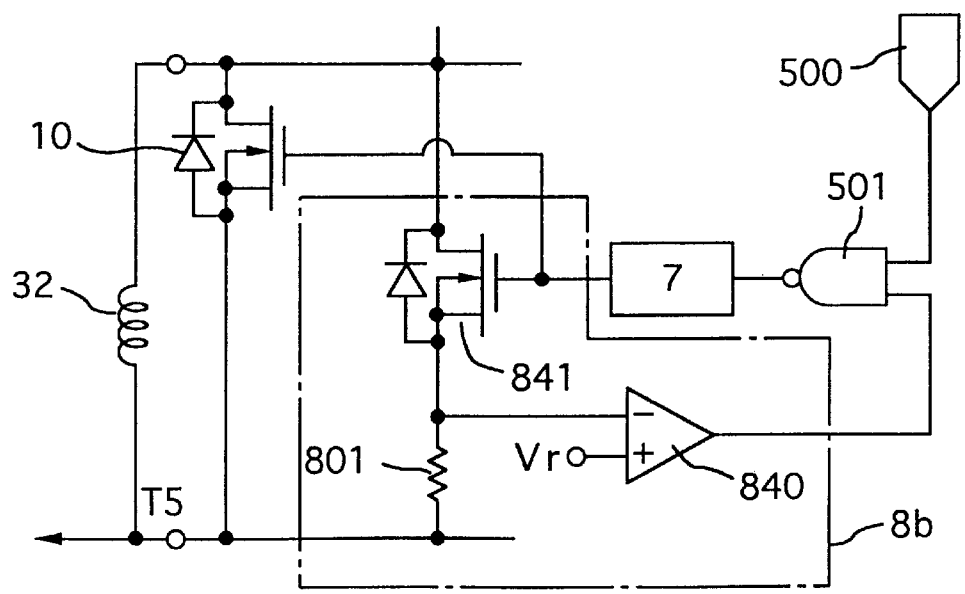
FIG. 5 is a circuit diagram of a part of a driving circuit of an inductive load driving apparatus according to a fifth embodiment of the present invention.

An inductive load driving apparatus according to a fifth embodiment of the present invention is described with reference to FIG. 4 and FIG. 5. The protection circuit 8a of the driving apparatus according to the fourth embodiment is replaced by a modified protection circuit 8b. The parts and/or components which are the same or substantially the same in function are denoted by the same reference numerals and descriptions thereof are omitted.

The protection circuit 8b has a supplementary switch 841 composed of an N-channel MOSFET in addition to the protection circuit 8a. The supplementary switch 841 is connected in parallel with the low-side switching element 10 and controlled by the second driving circuit 7 in synchronism with the low-side switching element 10. The resistor 801 is connected in series with the supplementary switch 841 in this embodiment. As a result, the energy loss of the back-flow current can be further reduced.

(Sixth Embodiment)

An inductive load driving apparatus according to a sixth embodiment of the present invention is described with reference to FIG. 6. The control apparatus 4 according to one of the embodiments described above is integrated into a semiconductor chip.

An SOI substrate 200 is formed with an N-type semiconductor substrate 221, P-type semiconductor substrate 220 and insulation film 222 for insulating both substrates 221 and 220. The N-type semiconductor substrates 221 and the P-type semiconductor substrate 220 are electrostatically bonded to each other via the insulation film 222. The N-type semiconductor substrate 221 is etched to have a suitable thickness and has $N^+$ domains formed on $N^-$ layers by doping.

The N-type semiconductor substrate 221 is dry-etched to have separation grooves. Then, after the surface of the grooves is oxidized, polysilicone is filled into the grooves to form dielectric separation domains 225. The dielectric separation grooves 225 divide the substrate 221 into insulated N-type island domains 201–203. An N-channel MOSFET for the low-side switching element 10 is formed on the island domain 201, and an N-channel MOSFET 9 for the high-side switching element 9 is formed on the island domain 202. The island domain 203 is further divided into smaller island domains to form various elements of the control apparatus 4.

A method of forming the high-side and low-side switching elements 10 and 11, each of which is a N-channel MOSFET, is described hereafter.

After forming $N^+$ domains 210, P-type impurities are injected twice to form deep P-well domains 209 and shallow P-well domains 208, and $P^+$ contact domains 212 and $N^+$ contact domain 213 are formed in the P-well domain 209. LOCOS layers 214 and gate oxide layers 215 are formed successively, and gate electrodes 205 are formed of doped polysilicone on the gate oxide layers 215. Then, insulation layers 216 are formed by the CVD method on the gate electrodes 205 to cover the same. Thereafter, an aluminum conductor 217 is formed after contact openings are formed in the insulation layers 216.

Thus, the $P^+$ contact domain 212 and the $N^+$ contact domain 213 of the low-side switching element 10 are grounded through a terminal T5. The $N^+$ domain 210 of the low-side switching element 10 is connected to the high-side terminal T4 of the field coil 32 through a lead 250 together with the $P^+$ contact domain 212 and the $N^+$ domain 213 of the high-side switching element 9. The $N^+$ domain 210 of the high-side switching element 9 is connected to the battery 2 through a terminal T3. The gate electrodes 205 of the high-side and low-side switching elements 9 and 10 are controlled by the control apparatus 4 formed on the island domains 203. The control apparatus 4 is formed in a BiCMOS integrated circuit by a method similar to the method of forming the high-side and low-side switching elements 9 and 10.

It is possible to form the control apparatus 4 in a bipolar integrated circuit or a BiNMOS integrated circuit composed of bipolar circuits and N-channel MOSFETS.

The operation of the low-side switching element 10 composed of an N-channel MOSFET is described in detail with reference to FIG. 6.

In the N-channel MOSFET, the $N^+$ domain 210 becomes a superficial source electrode and an outer portion x of the shallow P-well domain 208 becomes the real source electrode (i.e. the electric charge injection terminal) when the back-flow current flows therethrough. Accordingly, when the low-side switching element 10 passes the back-flow current, a resistor Rs of $N^-$ domain 218 having a high resistance exists between the domain 210 as the superficial source electrode and the portion x as the real source electrode. Therefore, the resistor Rs is connected in series with the channel resistor of the MOSFET. Because the channel resistor of the MOSFET changes as the potential difference Vgs between the potential Vg of the gate electrode 205 and the potential of the portion x changes, the channel resistance increases significantly as the voltage drop across the series-connected resistor Rs increases. The low-side switching element 10 has little potential difference and prevents the above problem.

When the high-side switching element 9 is turned off, field current supplied to the field coil 32 is cut, and the electric charge accumulated in a parasitic capacity on the side of the field coil 32 is discharged due to the back-flow current of the field coil 32 to lower the potential of the source domain 210 (i.e. on the high-side terminal of the field coil 32) of the low-side switching element 10. When the potential difference between the gate electrode 205 and the source electrode becomes the threshold voltage Vt of the low-side switching element 10, the channel of the low-side switching element 10 opens to allow the channel current i to flow therethrough. The channel current i is decided by the potential difference Vgs between the potential Vg of the gate electrode 205 and the potential of the real source electrode (the portion x).

Because the low-side switching element 10, which is composed of an N-channel MOSFET, is disposed at the low-side or ground side in the field current control circuit, the potential of the source electrode is nearly equal to the ground potential when the back-flow current starts flowing. That is, when the back-flow current starts flowing, the potential difference Vgs is very small as compared to the battery voltage which would be applied if the low-side switching element 10 was disposed as the battery side or the high-side in the field current control circuit. Thus, the low-side connection of the low-side switching element 10 reduces the on-resistance significantly.

Figure 6:
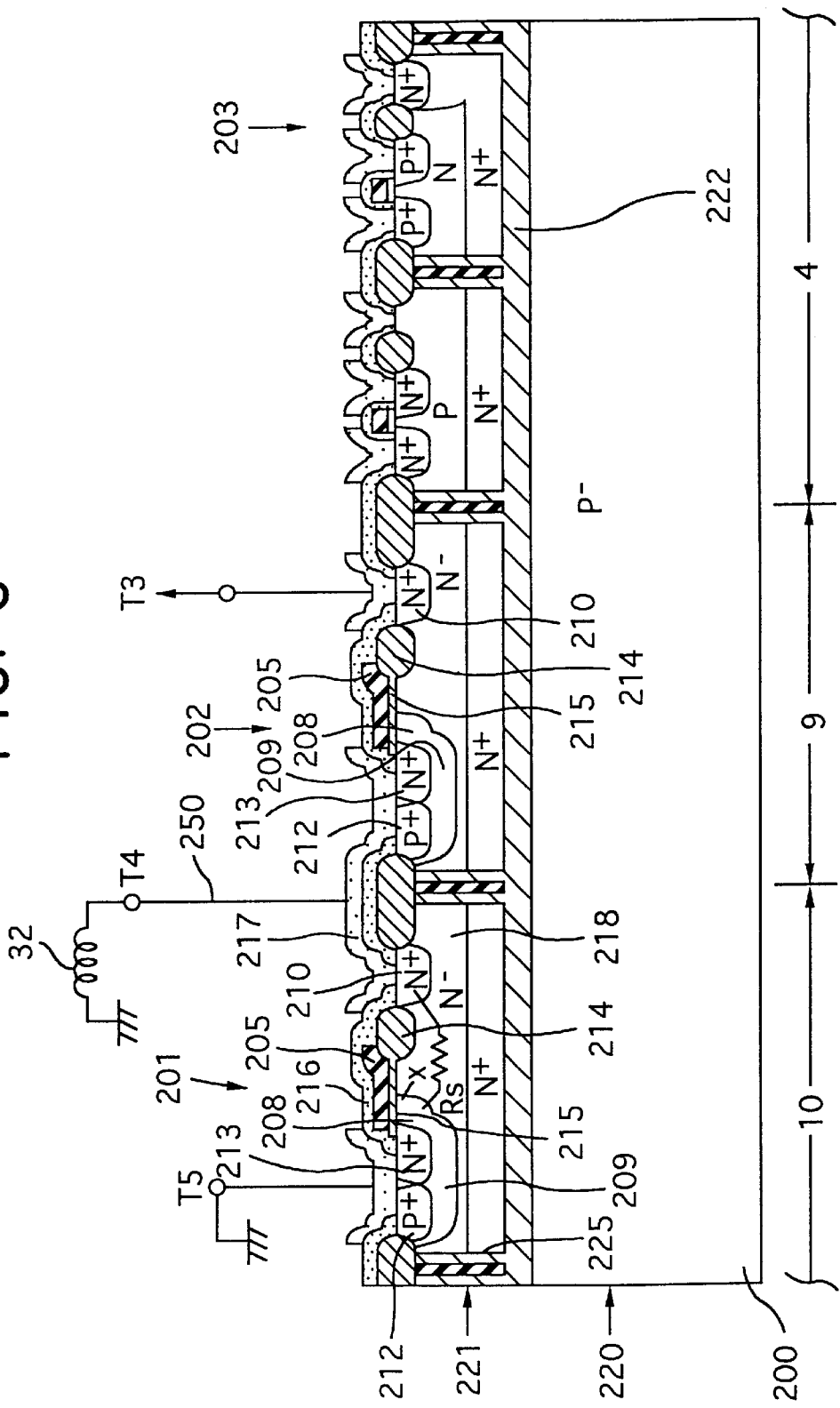
FIG. 6 is a schematic cross-sectional view illustrating an integrated circuit of an inductive load driving apparatus according to a sixth embodiment of the present invention.

As shown in FIG. 6, since the high-side and low-side switching elements are integrally formed, the source electrode 210 of the low-side switching element 10 and the drain electrode of the high-side switching element 9 can have the common conductor 217 connected to the high-side terminal of the field coil T4 through the lead 250. Further, because the operation time of the high-side switching element 9 and the low-side switching element 10 is entirely reversed, arrangement of the heat dissipation can be simple.

It is found that the maximum power loss P2 of the low-side switching element 10 is generated when the duty ratio thereof is about 70% and is about 50% of the power loss of the high-side switching element 9 generated when the duty ratio of the high-side switching element 9 is 100%. Therefore, if the high-side and low-side switching element is disposed separately, the on-resistance R2 of the low-side switching element 10 can be set between 1–3 times, preferably about 2 times, as many as the on-resistance R1 of the high-side switching element 9.

Figure 7:
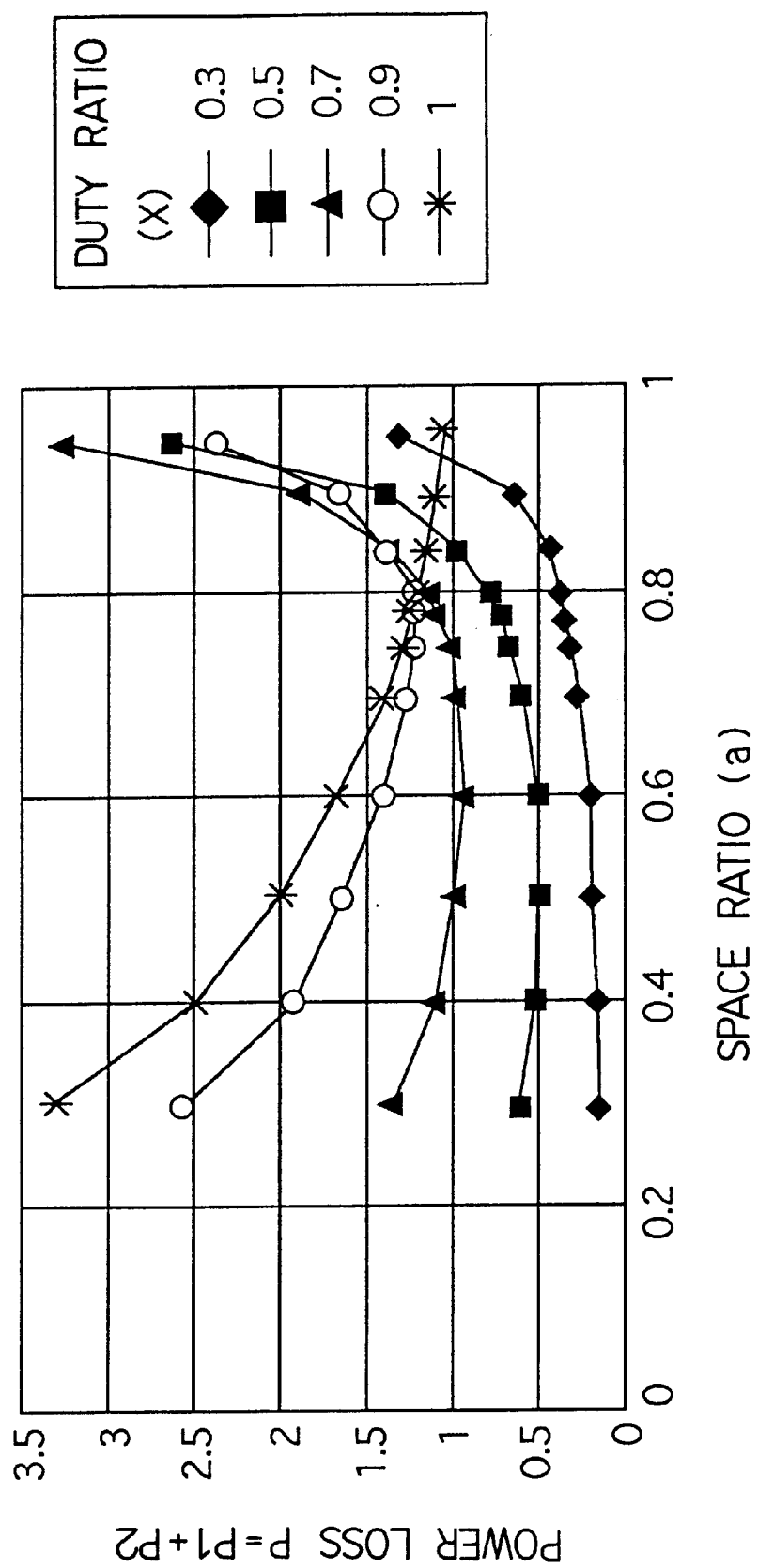
FIG. 7 is a graph showing relationship between sectional ratios of the high-side switching element and power losses of the high-side and the low-side switching elements at various on-duty ratios of the high-side switching element.

FIG. 7 is a graph showing relationship between space ratios a of the space areas for the high-side switching element integrated in a semiconductor chip and total power loss (P1+P2) of the high-side switching element 9 and the low-side switching element 10 at various duty ratio (the ratio of on time relative to one switching cycle) of the high-side switching element 9. From the graph, it can be said that the total power loss can be reduced if the space ratio a is between 0.6–0.9, preferably 0.65–0.85.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. An inductive load driving apparatus for supplying current from a battery to an inductive load, said driving apparatus comprising:

a first switching element connected between one of terminals of said battery and one of terminals of said inductive load, said first switching element having a gate; a first control circuit connected to said gate of said first switching element;

a second switching element connected in parallel with said inductive load, said second switching element having a gate;

a second control circuit connected to said gate of said second switching element;

a protection circuit having a back-flow current detecting element for turning off said second switching element when said inductive load does not generate back-flow current, wherein said second switching element comprises a MOSFET, and said second control circuit turns on said second switching element when said first switching element is turned off and turns off said switching element when said first switching element is turned on, and a battery voltage detecting circuit, wherein said first switching element comprised an N-channel MOSFET, said second switching element comprise an N-channel MOSFET, and said first control circuit comprises a booster circuit connected between said battery and said gate of said first switching element, and wherein said first control circuit regulates battery voltage by turning on and off said first switching element.

2. An inductive load driving apparatus as claimed in claim 1, wherein said first and second switching elements are disposed integrally with each other on a semiconductor chip.

3. An inductive load driving apparatus as claimed in claim 2, wherein said battery voltage detecting circuit is disposed integrally with said first and second switching elements on said semiconductor chip.

4. An inductive load driving apparatus as claimed in claim 2, wherein said first switching element has space area of said chip between 0.65 and 0.85 of total space area of said first switching element and said second switching element.

5. An inductive load driving apparatus as claimed in claim 2, wherein said second switching element is disposed to have on-resistance between 1 and 3 times as many as on-resistance of said first switching element.

6. An inductive load driving apparatus as claimed in claim 2, wherein said back-flow current detecting element of said protection circuit is disposed integrally with said first and second switching elements on said semiconductor chip.

7. An inductive load driving apparatus as claimed in claim 6, wherein said back-flow current element comprises a series circuit of a third switching circuit and a resistor connected in parallel with said second switching element, and said third switching element operates in synchronism with said second switching element.

8. An inductive load driving apparatus wherein for supplying current from a battery to an inductive load, said driving apparatus comprising:

a first switching element connected between one of terminals of said battery and one of terminals of said inductive load, said first switching element having a gate;

a first control circuit connected to said gate of said first switching element;

a second switching element connected in parallel with said inductive load, said second switching element having a gate;

a second control circuit connected to said gate of said second switching element;

a protection circuit having a back-flow current detecting element for turning off said second switching element when said inductive load does not generate back-flow current, wherein said second switching element comprises a MOSFET, and said second control circuit turns on said second switching element when said first switching element is turned off and turns off said switching element when said first switching element is turned on, and said back-flow current detecting element of said protection circuit comprises a voltage detecting element detecting voltage of said inductive load when said inductive load does not generate said back-flow current.

9. An inductive load driving apparatus for controlling current supplied from a battery to an inductor, said driving apparatus comprising:

a first switching element connected between a high-side terminal of said inductor and a high-side terminal of said battery, said first switching element having a gate;

a first control circuit connected to said gate of said first switching element;

a second switching element connected in parallel with said inductive load, said second switching element having a gate;

a second control circuit connected to said gate of said second switching element;

a protection circuit having a back-flow current detecting element for turning off said second switching element when said inductor does not generate back-flow current, wherein said second switching element comprises a MOSFET, and said control circuit turns on said second switching element when said first switching element is turned off and turns off said second switching element when said first switching element is turned on, and a battery voltage detecting circuit, wherein said first switching element comprised an N-channel MOSFET said second switching element comprise an N-channel MOSFET, and said first control circuit comprises a booster circuit connected between said battery and said gate of said first switching element, and wherein said first control circuit regulates battery voltage by turning on and off said first switching element.

10. An inductive load driving apparatus as claimed in claim 9, wherein said first and second switching elements are disposed integrally with each other on a semiconductor chip.

11. An inductive load driving apparatus for controlling current supplied from a battery to an inductor, said driving apparatus comprising:

a first N-channel MOSFET switching element connected between a high-side terminal of said inductor and a high-side terminal of said battery, said first switching element having a gate;

a first control circuit connected to said gate of said first N-channel MOSFET switching element;

a second N-channel MOSFET switching element having a gate and being connected in parallel with said inductive load, a second control circuit connected to said gate of said second N-channel MOSFET switching element; and a protection circuit having a back-flow current detecting element for turning off said second N-channel MOSFET switching element when said inductor does not generate back-flow current, wherein said first control circuit comprises a booster circuit connected between said battery and said gate of said first switching circuit, and said second control circuit turns on said second N-channel MOSFET switching element when said first N-channel MOSFET switching element is turned off and turns off said second switching element when said first switching element is turned on.

12. An inductive load driving apparatus as claimed in claim 11, wherein said first and second N-channel MOSFET switching elements are disposed integrally with each other on a semiconductor chip.

* * * * *